(12) United States Patent
Yamane

(10) Patent No.: US 10,886,896 B2
(45) Date of Patent: Jan. 5, 2021

(54) ACOUSTIC WAVE DEVICE, HIGH-FREQUENCY FRONT-END CIRCUIT, AND COMMUNICATION DEVICE

(71) Applicant: Murata Manufacturing Co., Ltd., Nagaokakyo (JP)

(72) Inventor: Takashi Yamane, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/532,523

(22) Filed: Aug. 6, 2019

(65) Prior Publication Data

US 2019/0363697 A1 Nov. 28, 2019

Related U.S. Application Data

(63) Continuation of application No. PCT/JP2017/040850, filed on Nov. 14, 2017.

(30) Foreign Application Priority Data

Feb. 10, 2017 (JP) ................. 2017-023097

(51) Int. Cl.
*H03H 9/64* (2006.01)
*H03H 9/72* (2006.01)
(Continued)

(52) U.S. Cl.
CPC ............ *H03H 9/706* (2013.01); *H03F 3/19* (2013.01); *H03F 3/21* (2013.01);
(Continued)

(58) Field of Classification Search
CPC ............ H03H 9/54; H03H 9/64; H03H 9/72
See application file for complete search history.

(56) References Cited

U.S. PATENT DOCUMENTS

2006/0103486 A1 5/2006 Ruile et al.
2013/0049889 A1 2/2013 Shimizu
(Continued)

FOREIGN PATENT DOCUMENTS

JP 2005-260909 A 9/2005
JP 2006-513649 A 4/2006
(Continued)

OTHER PUBLICATIONS

Official Communication issued in International Patent Application No. PCT/JP2017/040850, dated Jan. 23, 2018.

*Primary Examiner* — Dean O Takaoka
(74) *Attorney, Agent, or Firm* — Keating & Bennett, LLP

(57) ABSTRACT

An acoustic wave device includes IDT electrodes with different wavelengths determined by electrode finger pitches. A piezoelectric thin film is laminated directly on or indirectly above a high acoustic velocity member. A silicon oxide film is laminated on the piezoelectric thin film, IDT electrodes are laminated on the silicon oxide film. When $\lambda$ represents a wavelength of one of the IDT electrodes having the shortest wavelength, y represents a wavelength normalized film thickness (%) that is a percentage of a film thickness of the piezoelectric thin film with respect to the wavelength $\lambda$, and x represents a wavelength normalized film thickness (%) that is a percentage of a film thickness of the silicon oxide film with respect to the wavelength $\lambda$, y is equal to or smaller than about 350% and $y<1.6x^{(-0.01)}+0.05x^{(-0.6)}-1$ is satisfied.

20 Claims, 7 Drawing Sheets

(51) Int. Cl.

| | | |
|---|---|---|
| *H03H 9/70* | (2006.01) | |
| *H03F 3/19* | (2006.01) | |
| *H03F 3/21* | (2006.01) | |
| *H03H 9/02* | (2006.01) | |
| *H03H 9/205* | (2006.01) | |
| *H03H 9/54* | (2006.01) | |

(52) U.S. Cl.
CPC ........ *H03H 9/02007* (2013.01); *H03H 9/205* (2013.01); *H03H 9/54* (2013.01)

(56) References Cited

U.S. PATENT DOCUMENTS

| | | |
|---|---|---|
| 2013/0285768 A1 | 10/2013 | Watanabe et al. |
| 2014/0152145 A1 | 6/2014 | Kando et al. |
| 2015/0033521 A1* | 2/2015 | Watanabe ................ H03H 3/02 29/25.35 |
| 2016/0329876 A1* | 11/2016 | Watanabe ................ H03H 9/54 |
| 2016/0344369 A1* | 11/2016 | Kadota .............. H03H 9/02559 |
| 2018/0102761 A1 | 4/2018 | Takai et al. |

FOREIGN PATENT DOCUMENTS

| | | |
|---|---|---|
| JP | 2013-046107 A | 3/2013 |
| WO | 2012/086639 A1 | 6/2012 |
| WO | 2012073871 A1 | 6/2012 |
| WO | 2017013968 A1 | 1/2017 |

\* cited by examiner

ACOUSTIC WAVE DEVICE, HIGH-FREQUENCY FRONT-END CIRCUIT, AND COMMUNICATION DEVICE

CROSS REFERENCE TO RELATED APPLICATIONS

This application claims the benefit of priority to Japanese Patent Application No. 2017-023097 filed on Feb. 10, 2017 and is a Continuation Application of PCT Application No. PCT/JP2017/040850 filed on Nov. 14, 2017. The entire contents of each application are hereby incorporated herein by reference.

BACKGROUND OF THE INVENTION

1. Field of the Invention

The present invention relates to an acoustic wave device including a plurality of IDT electrodes having different wavelengths determined by electrode finger pitches, a high-frequency front-end circuit, and a communication device including the acoustic wave device.

2. Description of the Related Art

There has been known an acoustic wave device including a piezoelectric thin film, capable of coping with a higher frequency, and enabling an increase in a Q value. For example, in an acoustic wave device described in International Publication No. 2012/086639, a high acoustic velocity film, a low acoustic velocity film, a piezoelectric thin film, and an IDT electrode are laminated in this order on a supporting substrate. A low acoustic velocity film, a piezoelectric thin film, and an IDT electrode are laminated in this order on a high acoustic velocity supporting substrate.

On the other hand, in an acoustic wave device described in Japanese Unexamined Patent Application Publication No. 2005-260909, a dielectric film is laminated between a piezoelectric substrate and an IDT electrode. Thus, an absolute value of a temperature coefficient of frequency TCF is reduced.

As described in Japanese Unexamined Patent Application Publication No. 2005-260909, when the dielectric film is laminated between the piezoelectric substrate and the IDT electrode, the absolute value of the temperature coefficient of frequency TCF is able to be reduced. Furthermore, a bandwidth ratio may be adjusted to be a smaller value. By applying such a configuration to a structure described in International Publication No. 2012/086639, it is also possible to improve frequency temperature characteristics. However, in the structure described in International Publication No. 2012/086639, a piezoelectric thin film having a thickness about equal to or smaller than 3.5λ is used, instead of a piezoelectric substrate. Note that λ is a wavelength determined by an electrode finger pitch of the IDT electrode. In the structure described above, when a plurality of acoustic wave resonators having different wavelengths are formed within one chip, there is a problem as follows. That is, a relationship between wavelength normalized film thicknesses of the piezoelectric thin films and a relationship between wavelength normalized film thicknesses of the dielectric films are different among the plurality of acoustic wave resonators. Therefore, there is a possibility that differences in temperature characteristics are increased among the plurality of acoustic wave resonators.

Such a problem has been found not only in a plurality of acoustic wave elements, but also in an acoustic wave device including a plurality of IDT electrodes having different electrode finger pitches within one acoustic wave element.

SUMMARY OF THE INVENTION

Preferred embodiments of the present invention provide acoustic wave devices each including a plurality of IDT electrodes having different wavelengths determined by electrode finger pitches, and being capable of reducing a difference in temperature characteristics between at least two IDT electrodes. In addition, preferred embodiments of the present invention provide high-frequency front-end circuits and communication devices each including an acoustic wave device according to a preferred embodiment of the present invention and having excellent frequency temperature characteristics.

An acoustic wave device according to a preferred embodiment of the present invention includes a high acoustic velocity member, a piezoelectric thin film laminated directly or indirectly on the high acoustic velocity member, a silicon oxide film laminated on or above the piezoelectric thin film, and a plurality of IDT electrodes laminated on or above the silicon oxide film, in which an acoustic velocity of a bulk wave propagating through the high acoustic velocity member is higher than an acoustic velocity of an acoustic wave propagating through the piezoelectric thin film, the plurality of IDT electrodes include a plurality of IDT electrodes having different wavelengths determined by electrode finger pitches, and when λ represents a wavelength of an IDT electrode having a shortest wavelength among the plurality of IDT electrodes having different wavelengths, y represents a wavelength normalized film thickness (%) that is a percentage of a film thickness of the piezoelectric thin film with respect to the wavelength λ, and x represents a wavelength normalized film thickness (%) that is a percentage of a film thickness of the silicon oxide film with respect to the wavelength λ, y is equal to or smaller than about 350%, and $y < 1.6x^{(-0.01)} + 0.05x^{(-0.6)} - 1$ is satisfied.

In an acoustic wave device according to a preferred embodiment of the present invention, the wavelength normalized film thickness x (%) of the silicon oxide film is 0<x<8(%). In this case, it is possible to provide an acoustic wave device that has excellent frequency temperature characteristics without significantly narrowing a bandwidth ratio.

In an acoustic wave device according to a preferred embodiment of the present invention, the wavelength normalized film thickness y (%) of the piezoelectric thin film is equal to or smaller than about 80%. In this case, it is possible to further effectively improve the frequency temperature characteristics.

In an acoustic wave device according to a preferred embodiment of the present invention, the acoustic wave device further includes a low acoustic velocity film laminated between the high acoustic velocity member and the piezoelectric thin film, in which an acoustic velocity of a bulk wave propagating through the low acoustic velocity film is lower than an acoustic velocity of an acoustic wave propagating through the piezoelectric thin film.

In an acoustic wave device according to a preferred embodiment of the present invention, the acoustic wave device further includes a supporting substrate, and the high acoustic velocity member is laminated on the supporting substrate.

In an acoustic wave device according to a preferred embodiment of the present invention, the high acoustic velocity member also defines and functions as a supporting substrate.

In an acoustic wave device according to a preferred embodiment of the present invention, the high acoustic velocity member is made of at least one material selected from the group consisting of aluminum nitride, aluminum oxide, silicon carbide, silicon nitride, silicon, sapphire, lithium tantalate, lithium niobate, quartz crystal, alumina, zirconia, cordierite, mullite, steatite, forsterite, magnesia, silicon oxynitride, DLC, and diamond, or made of a material containing the at least one material as a main component.

In an acoustic wave device according to a preferred embodiment of the present invention, the low acoustic velocity film is made of at least one material selected from the group consisting of silicon oxide, glass, silicon oxynitride, tantalum oxide, and compounds obtained by adding fluorine, carbon, or boron to silicon oxide.

In an acoustic wave device according to a preferred embodiment of the present invention, the supporting substrate is made of at least one material selected from the group consisting of a piezoelectric material, such as silicon, aluminum nitride, aluminum oxide, silicon carbide, silicon nitride, silicon oxynitride, sapphire, lithium tantalate, lithium niobate, and quartz crystal, alumina, zirconia, cordierite, mullite, steatite, forsterite, diamond, and magnesia.

In an acoustic wave device according to a preferred embodiment of the present invention, the plurality of IDT electrodes define a plurality of acoustic wave elements. In this case, the acoustic wave element may be one of an acoustic wave resonator and an acoustic wave filter.

In an acoustic wave device according to a preferred embodiment of the present invention, a longitudinally coupled resonator acoustic wave filter including the plurality of IDT electrodes is provided. In this case, it is possible to effectively improve frequency temperature characteristics of the longitudinally coupled resonator acoustic wave filter.

In an acoustic wave device according to a preferred embodiment of the present invention, the piezoelectric thin film is made of a $LiTaO_3$ piezoelectric single crystal. In this case, frequency temperature characteristics of the acoustic wave device using a piezoelectric thin film made of the $LiaO_3$ piezoelectric single crystal are able to be more effectively improved.

A high-frequency front-end circuit according to a preferred embodiment of the present invention includes an acoustic wave device according to a preferred embodiment of the present invention and a power amplifier.

A communication device according to a preferred embodiment of the present invention includes a high-frequency front-end circuit according to a preferred embodiment of the present invention and an RF signal processing circuit.

With the acoustic wave devices, the high-frequency front-end circuits, and the communication devices according to preferred embodiments the present invention, in the acoustic wave device including the plurality of IDT electrodes having different wavelengths determined by electrode finger pitches, it is possible to reduce a difference in temperature characteristics between at least two IDT electrodes.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described and clarified with reference to the accompanying drawings.

It should be noted that the preferred embodiments described herein are exemplary and that a partial replacement or combination of configurations may be possible between different preferred embodiments.

Figure 1:
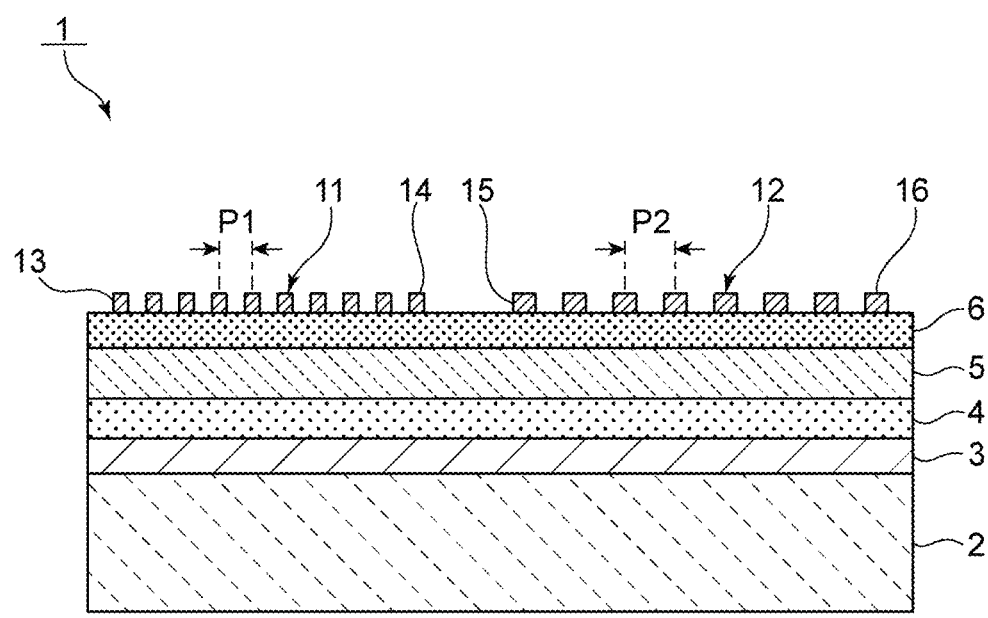
FIG. 1 is a front sectional view of an acoustic wave device according to a first preferred embodiment of the present invention.
Figure 2:
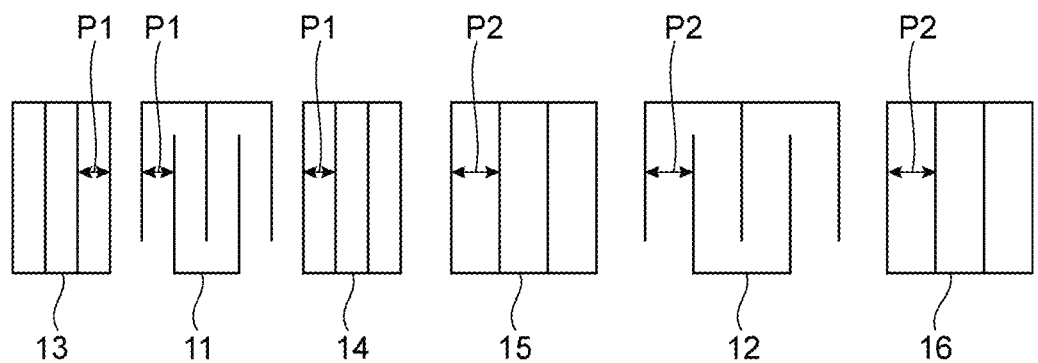
FIG. 2 is a schematic plan view illustrating a structure of electrodes included in the acoustic wave device according to the first preferred embodiment of the present invention.

FIG. 1 is a front sectional view of an acoustic wave device according to a first preferred embodiment of the present invention, and FIG. 2 is a schematic plan view illustrating a structure of electrodes included in the acoustic wave device according to the present preferred embodiment.

As illustrated in FIG. 1, an acoustic wave device 1 includes a supporting substrate 2. A high acoustic velocity film 3 defining a high acoustic velocity member, a low acoustic velocity film 4, a piezoelectric thin film 5 preferably made of $LiTaO_3$, for example, and a silicon oxide film 6 are laminated in this order on the supporting substrate 2. In other words, the piezoelectric film 3 is provided between the high acoustic velocity film 4 and the silicon oxide film 6. A first IDT electrode 11 and a second IDT electrode 12 are provided on the silicon oxide film 6. In other words, the silicon oxide film 6 is provided between the piezoelectric thin film and the first IDT electrode 11 and the second IDT electrode 12.

In the acoustic wave device 1, a structure and configuration of electrodes illustrated in FIG. 2 is provided on the silicon oxide film 6.

As illustrated in FIG. 2, reflectors 13 and 14 are provided on both sides in an acoustic wave propagation direction of the first IDT electrode 11. Thus, a first acoustic wave resonator is provided. Reflectors 15 and 16 are provided on both sides in an acoustic wave propagation direction of the second IDT electrode 12. Thus, a second acoustic wave resonator is provided.

A first electrode finger pitch P1 in the first IDT electrode 11 is different from a second electrode finger pitch P2 in the second IDT electrode 12. More specifically, P2>P1 is preferably satisfied.

The supporting substrate 2 is preferably made of silicon (Si), for example. However, the supporting substrate 2 may be made of a suitable material as long as it is able to support a laminated structure including the high acoustic velocity film 3, the low acoustic velocity film 4, the piezoelectric thin film 5, the silicon oxide film 6, and the first and second IDT electrodes 11 and 12. As a material for the supporting substrate 2, a piezoelectric material such as aluminum oxide, diamond, sapphire, lithium tantalate, lithium niobate, or quartz crystal, various ceramics such as alumina, magnesia, silicon nitride, aluminum nitride, silicon carbide, zirconia, cordierite, mullite, steatite, or forsterite, a dielectric material such as glass, a semiconductor material such as gallium nitride, a resin substrate, and the like may be used.

The above-described high acoustic velocity film 3 confines an acoustic wave in a portion where the piezoelectric thin film 5 and the low acoustic velocity film 4 are laminated, and prevents the acoustic wave from leaking to a structure below the high acoustic velocity film 3. In the present preferred embodiment, the high acoustic velocity film 3 is preferably made of aluminum nitride, for example. However, as long as the above-described acoustic wave is able to be confined, various materials such as, for example, aluminum oxide, silicon carbide, silicon nitride, silicon oxynitride, silicon, sapphire, lithium tantalate, lithium niobate, quartz crystal, alumina, zirconia, cordierite, mullite, steatite, forsterite, magnesia, DLC (diamond-like carbon), or diamond, a medium containing the above-mentioned material as a main component, and a medium containing a mixture of the above-mentioned materials as a main component may be used as a high acoustic velocity material. In order to confine the acoustic wave in the portion where the piezoelectric thin film 5 and the low acoustic velocity film 4 are laminated, a thickness of the high acoustic velocity film 3 is preferably larger, more preferably equal to or larger than about 0.5 times a wavelength λ of the acoustic wave, and even more preferably equal to or larger than about 1.5 times the wavelength λ of the acoustic wave, for example.

In this specification, the high acoustic velocity film refers to a film in which an acoustic velocity of a bulk wave propagating through the high acoustic velocity film 3 is higher than that of the acoustic wave propagating through the piezoelectric thin film 5. The low acoustic velocity film 4 refers to a film in which an acoustic velocity of a bulk wave propagating through the low acoustic velocity film 4 is lower than that of the acoustic wave propagating through the piezoelectric thin film 5.

As a material used for the low acoustic velocity film 4, a suitable material having an acoustic velocity of a bulk wave that is a lower acoustic velocity than that of the acoustic wave propagating through the piezoelectric thin film 5 may be used. As such a low acoustic velocity material, it is possible to use a medium containing, for example, a material such as silicon oxide, glass, silicon oxynitride, tantalum oxide, or a compound obtained by adding fluorine, carbon, or boron to silicon oxide as a main component.

The high acoustic velocity film 3 and the low acoustic velocity film 4 are made of a suitable dielectric material capable of achieving a high acoustic velocity and a low acoustic velocity determined as described above.

In the present preferred embodiment, the piezoelectric thin film 5 is preferably made of $LiTaO_3$, for example. However, the piezoelectric thin film 5 may be made of another piezoelectric single crystal, such as $LiNbO_3$, for example.

The silicon oxide film 6 is preferably made of $SiO_x$ such as $SiO_2$, for example. In addition, x is a numerical value larger than zero.

The first IDT electrode 11, the second IDT electrode 12, and the reflectors 13, 14, 15, and 16 are made of a suitable metal or alloy. Examples of such metal or alloy include Al, Cu, Pt, Au, Ag, Ti, Cr, Mo, W, and alloy containing any of these metals as a main component. Further, the first IDT electrode 11, and the second IDT electrode 12, and the reflectors 13 to 16 may have a structure including a plurality of metal films made of such metal or metal alloy that are laminated. As described above, P1<P2 is satisfied. Therefore, a wavelength of the first IDT electrode 11 determined by the first electrode finger pitch P1 is defined as $\lambda 1$, and a wavelength of the second IDT electrode 12 determined by the second electrode finger pitch P2 is defined as $\lambda 2$. In this case, $\lambda 1 < \lambda 2$ is satisfied.

Therefore, when a wavelength normalized film thickness (%), which is a percentage of a film thickness of the piezoelectric thin film 5 with respect to the wavelength λ in the first acoustic wave resonator including the first IDT electrode 11, is defined as y1 (%), and a wavelength normalized film thickness (%), which is a percentage of a film thickness of the piezoelectric thin film 5 with respect to the wavelength λ in the second acoustic wave resonator including the second IDT electrode 12, is defined as y2 (%), the first IDT electrode 11 and the second IDT electrode 12 are formed on the same piezoelectric thin film 5, and therefore, y1>y2 is satisfied. Note that a film thickness of the piezoelectric thin film in the first IDT electrode 11 and a film thickness of the piezoelectric thin film in the second IDT electrode 12 are preferably equal or substantially equal to each other.

Similarly, when a wavelength normalized film thickness (%), which is a percentage of a film thickness of the silicon oxide film 6 with respect to the wavelength λ in the first acoustic wave resonator, is defined as x1 (%), and a wavelength normalized film thickness (%), which is a percentage of a film thickness of the silicon oxide film 6 with respect to the wavelength λ in the second acoustic wave resonator, is defined as x2 (%), a film thickness of the silicon oxide film 6 in a portion where the first IDT electrode 11 is provided and a film thickness of the silicon oxide film 6 in a portion where the second IDT electrode 12 is provided are equal to each other, and therefore x1>x2 is satisfied. Note that the film thickness of the silicon oxide film 6 in the portion where the first IDT electrode 11 is provided and the film thickness of the silicon oxide film 6 in the portion where the second IDT electrode 12 is provided are preferably equal or substantially equal to each other.

In the acoustic wave device 1 of the present preferred embodiment, of the first IDT electrode 11 and the second IDT electrode 12, when the wavelength λ1 of the first IDT electrode 11 that is an IDT electrode having the shortest wavelength is set to λ, the wavelength normalized film thickness (%) that is a percentage of a film thickness of the piezoelectric thin film 5 with respect to λ is set to y, and the wavelength normalized film thickness (%) that is a percentage of a film thickness of the silicon oxide film 6 with respect to the wavelength λ is set to x, y is equal to or smaller than about 350% and $y<1.6x^{(-0.01)}+0.05x^{(-0.6)}-1$ is satisfied. Thus, a tendency of change in TCF in the first acoustic wave resonator having a relatively small electrode finger pitch and a tendency of change in TCF in the second acoustic wave resonator having a relatively large electrode finger pitch are able to be canceled out.

Therefore, it is possible to reduce a difference between temperature characteristics of the first and second acoustic wave resonators. This will be described in detail below.

Figure 3:
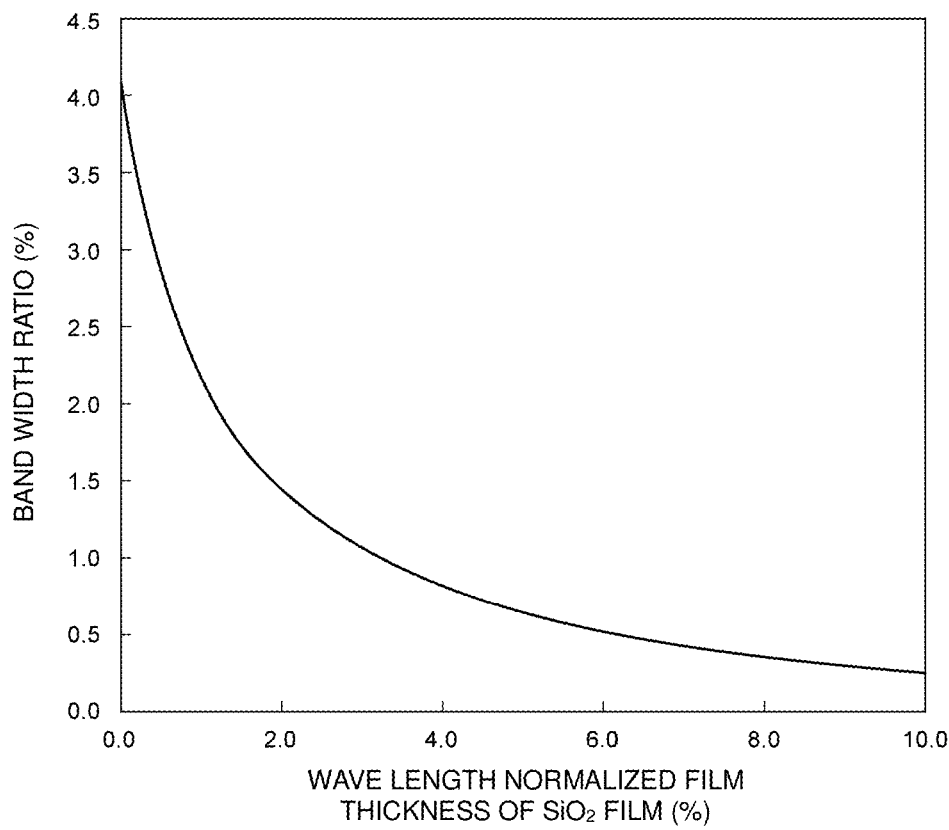
FIG. 3 is a diagram illustrating a relationship between a wavelength normalized film thickness (%) of a silicon oxide film and a bandwidth ratio of an acoustic wave resonator.

FIG. 3 is a diagram illustrating a relationship between the wavelength normalized film thickness of the silicon oxide film and a bandwidth ratio in the first acoustic wave resonator. The bandwidth ratio is a percentage (%) of a frequency bandwidth between a resonant frequency and an anti-resonant frequency with respect to the resonant frequency. Further, the wavelength normalized film thickness (%) of the silicon oxide film corresponds to x in the above formula.

As shown in FIG. 3, in the first acoustic wave resonator, as the wavelength normalized film thickness (%) of the silicon oxide film becomes larger than 0%, the bandwidth ratio becomes smaller. Therefore, by adjusting the wavelength normalized film thickness of the silicon oxide film, it is possible to control the bandwidth ratio. However, when the wavelength normalized film thickness of the silicon oxide film exceeds about 8%, the bandwidth ratio does not change significantly. Therefore, in order to control the bandwidth ratio and obtain the sufficient bandwidth ratio, the wavelength normalized film thickness x (%) of the silicon oxide film is preferably set to 0<x<8.

Figure 4:
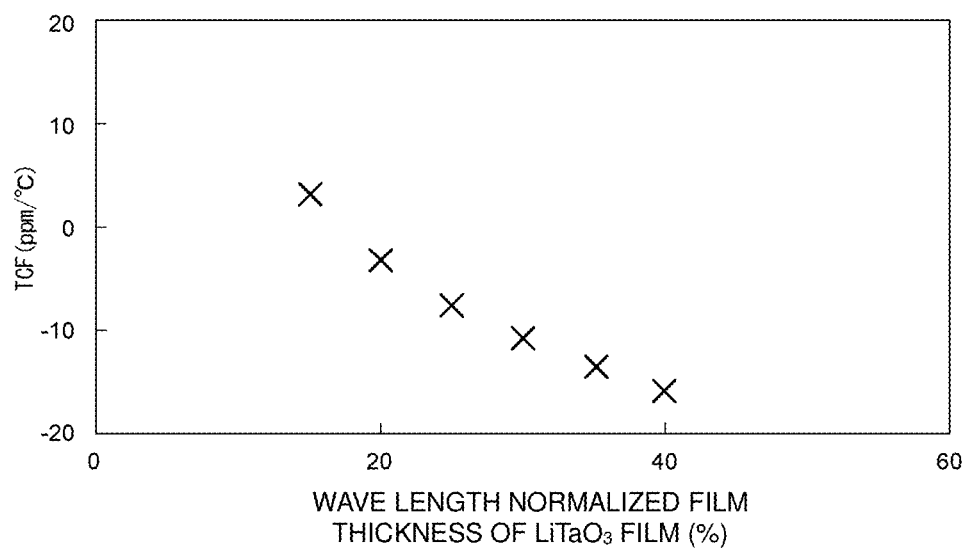
FIG. 4 is a diagram illustrating a relationship between a wavelength normalized film thickness (%) of a $LiaO_3$ film and a TCF.

FIG. 4 is a diagram illustrating a relationship between a wavelength normalized film thickness y (%) of a $LiaO_3$ film as the piezoelectric thin film 5 in the first acoustic wave resonator and a temperature coefficient of frequency TCF (ppm/° C.). In FIG. 4, values of the temperature coefficient of frequency TCF at the anti-resonant frequency are plotted.

As shown in FIG. 4, as the wavelength normalized film thickness y (%) of the $LiaO_3$ film increases, an absolute value of the temperature coefficient of frequency TCF becomes larger in a negative region. That is, as y (%) becomes larger, frequency temperature characteristics deteriorate.

Figure 5:
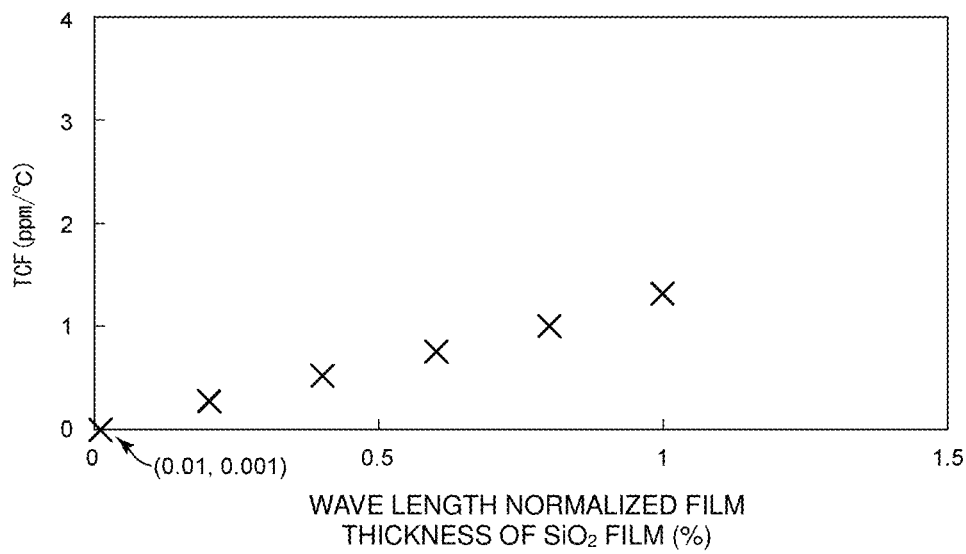
FIG. 5 is a diagram illustrating a relationship between a wavelength normalized film thickness (%) of a silicon oxide film and a TCF.

On the other hand, FIG. 5 illustrates a relationship between the wavelength normalized film thickness (%) of the silicon oxide film and a temperature coefficient of frequency TCF. Also in FIG. 5, values of the TCF at the anti-resonant frequency are plotted.

In FIG. 5, it is understood that the temperature coefficient of frequency TCF gradually increases as the wavelength normalized film thickness of the silicon oxide film becomes larger.

As shown in FIGS. 4 and 5, a tendency of change in TCF due to the wavelength normalized film thickness of the $LiTaO_3$ film and a tendency of change in TCF due to the wavelength normalized film thickness of the silicon oxide film are opposite to each other. Therefore, in the acoustic wave device 1 of the present preferred embodiment, the tendency of change in TCF of the first acoustic wave resonator having a relatively small electrode finger pitch and the tendency of change in TCF of the second acoustic wave resonator having a relatively large electrode finger pitch are able to be canceled out. Therefore, it is possible to reduce a difference in temperature characteristics between the first and second acoustic wave resonators.

Figure 6:
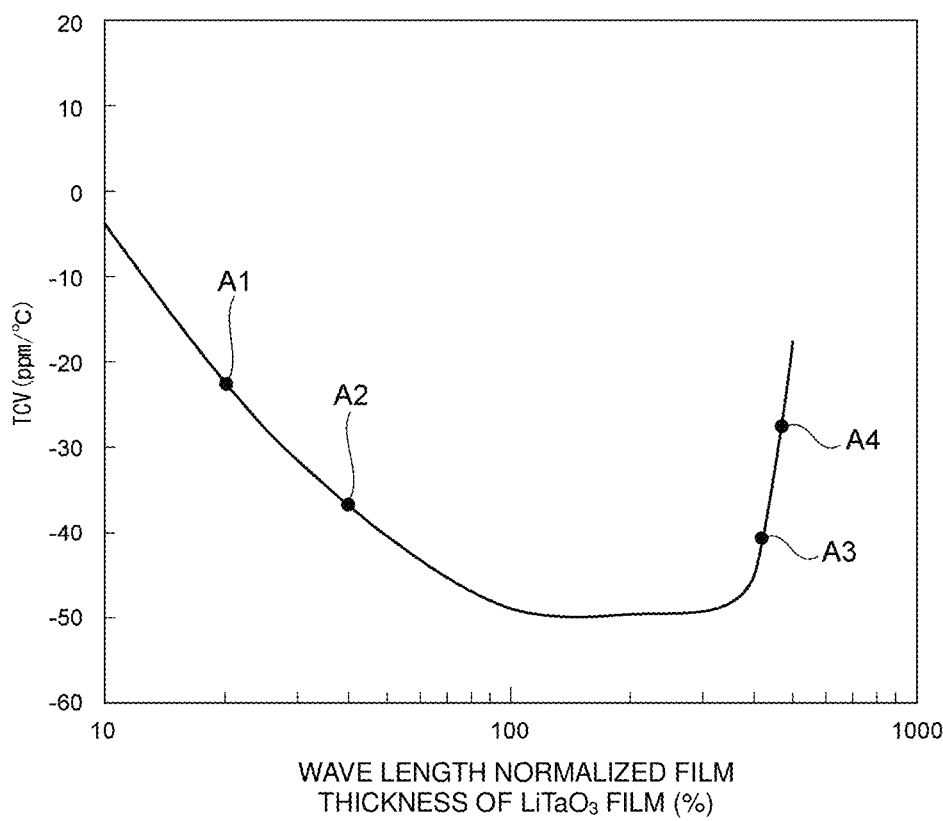
FIG. 6 is a diagram illustrating a relationship between a wavelength normalized film thickness (%) of a $LiaO_3$ film and a TCV in an acoustic wave resonator in which a wavelength normalized film thickness of a silicon oxide film is about 0.9%.
Figure 7:
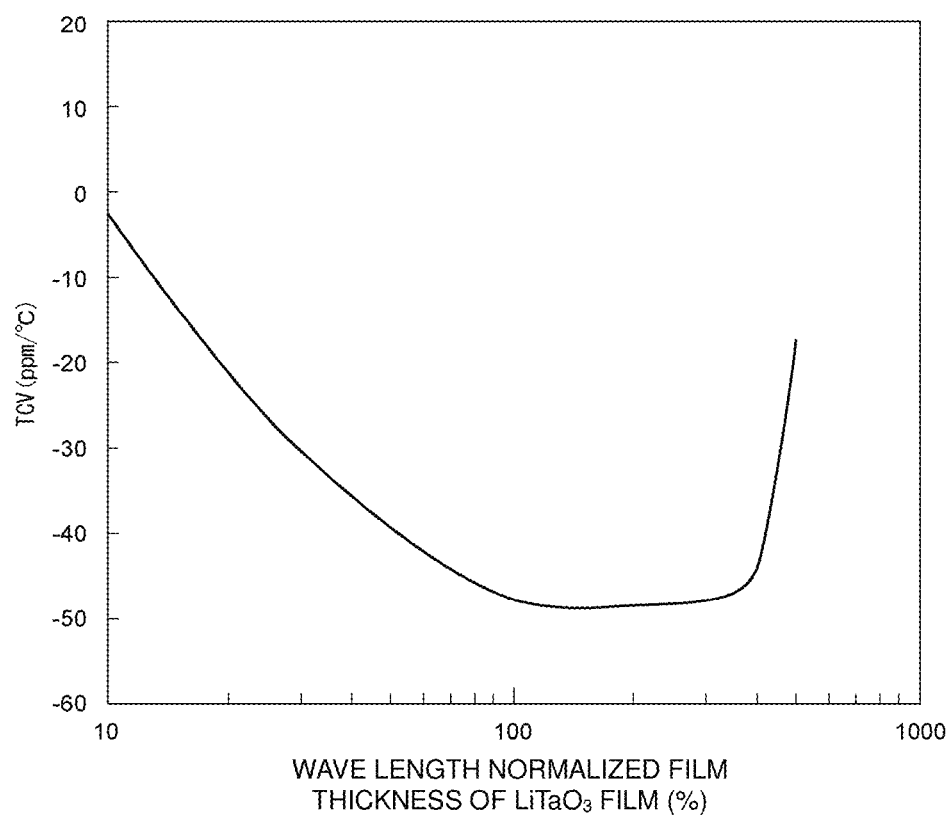
FIG. 7 is a diagram illustrating a relationship between a wavelength normalized film thickness (%) of a $LiaO_3$ film and a TCV in an acoustic wave resonator in which a wavelength normalized film thickness of a silicon oxide film is about 1.4%.
Figure 8:
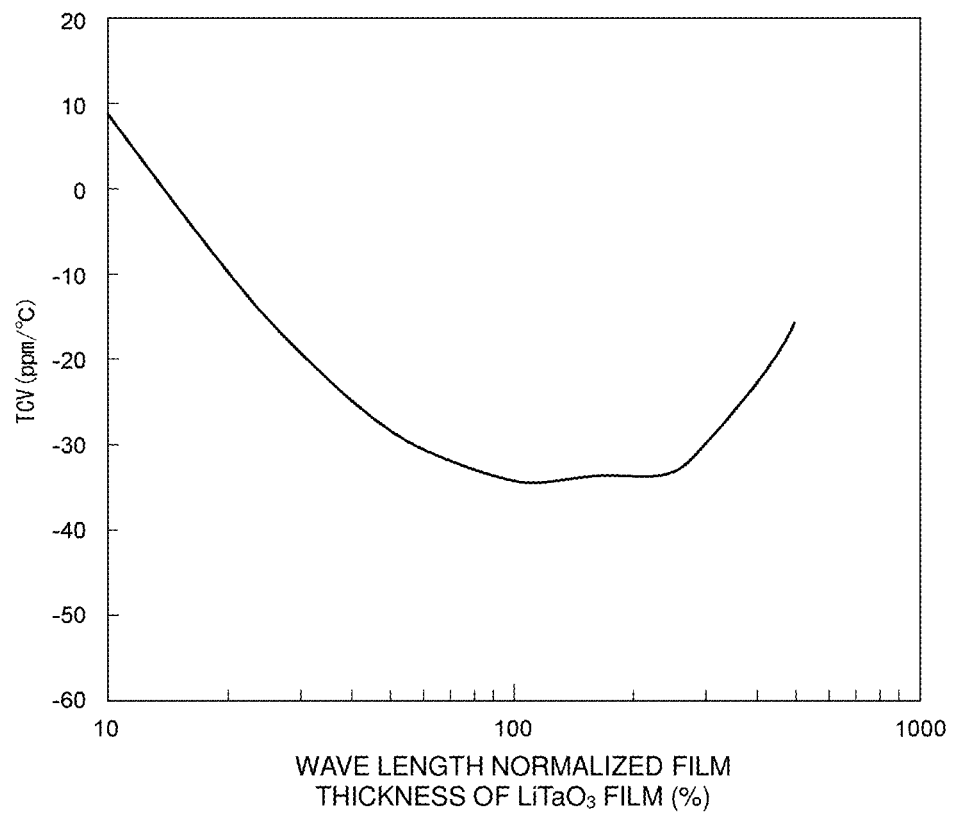
FIG. 8 is a diagram illustrating a relationship between a wavelength normalized film thickness (%) of a $LiTaO_3$ film and a TCV in an acoustic wave resonator in which a wavelength normalized film thickness of a silicon oxide film is about 6.5%.

FIG. 6 is a diagram illustrating a relationship between the wavelength normalized film thickness (%) of the $LiaO_3$ film and the temperature coefficient of frequency TCV (ppm/° C.) in the acoustic wave resonator in a case where the wavelength normalized film thickness of the silicon oxide film is about 0.9%. FIG. 7 is a diagram illustrating a relationship between the wavelength normalized film thickness (%) of the $LiTaO_3$ film and the TCV (ppm/° C.) at the anti-resonant frequency in the acoustic wave resonator in a case where the wavelength normalized film thickness of the silicon oxide film is about 1.4%. FIG. 8 is a diagram illustrating a relationship between the wavelength normalized film thickness (%) of the $LiTaO_3$ film and the TCV (ppm/° C.) in the acoustic wave resonator in a case where the wavelength normalized film thickness of the silicon oxide film is about 6.5%.

In FIGS. 6 to 8, when the wavelength normalized film thickness of the $LiTaO_3$ film becomes larger than about 10%, an absolute value of the TCV gradually increases in a negative region. When the wavelength normalized film thickness of the $LiTaO_3$ film exceeds about 350%, the tendency of change in TCV is reversed with an increase in the wavelength normalized film thickness of the $LiTaO_3$ film.

In FIGS. 6, 7, and 8, and for various cases of the wavelength normalized film thickness of the silicon oxide film, similarly with a change in the wavelength normalized film thickness of the $LiTaO_3$ film, a region where the TCV gradually increases in the negative region, that is, a range where tendencies of improving frequency temperature characteristics in the first acoustic wave resonator and the second acoustic wave resonator are able to be canceled out, is determined.

Figure 9:
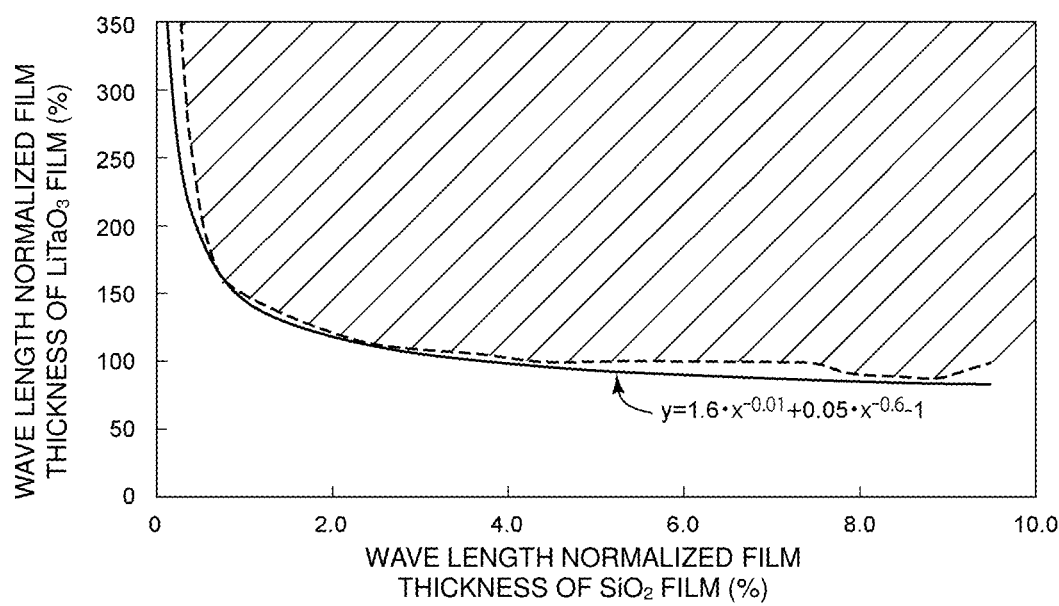
FIG. 9 is a diagram illustrating a region in which a TCF at an anti-resonant frequency is not canceled out.

In FIG. 9, a horizontal axis represents the wavelength normalized film thickness (%) of the silicon oxide film, a vertical axis represents the wavelength normalized film thickness (%) of the $LiTaO_3$ film, and a region hatched by oblique lines in FIG. 9 represents a region where tendencies of improving the frequency temperature characteristics in the first acoustic wave resonator and the second acoustic wave resonator cannot be canceled out. That is, for example, at points A3 and A4 in FIG. 6, when the wavelength normalized film thickness of the $LiTaO_3$ film changes from the point A3 to the point A4, the TCV changes in a direction in which the absolute value of the TCV becomes small. Therefore, this change in temperature characteristics cannot be canceled out by a change in temperature characteristics due to a change in the wavelength normalized film thickness of the silicon oxide film.

Accordingly, the points A3 and A4 are located in the region hatched by oblique lines in FIG. 9. On the other hand, at points A1 and A2 in FIG. 6, when the wavelength normalized film thickness of the $LiaO_3$ film becomes relatively thick, the absolute value of the TCV becomes large. Therefore, the tendencies of improving the frequency temperature characteristics of the first acoustic wave resonator and the second acoustic wave resonator are able to be canceled out. Therefore, the points A1 and A2 are located outside the region hatched by oblique lines in FIG. 9.

In FIG. 9, an outer edge of a region hatched by the oblique lines where an effect of the present preferred embodiment is not obtained is illustrated by a broken line, and a curve where the broken line is approximated is represented by $y=1.6x^{(-0.01)}+0.05x^{(-0.6)}-1$. Therefore, when $y<1.6x^{(-0.01)}+0.05x^{(-0.6)}-1$ is satisfied, the tendencies of change in TCFs of the first acoustic wave resonator and the second acoustic wave resonator are able to be canceled out in accordance with the present invention. Therefore, it is possible to reduce the difference in frequency temperature characteristics in the acoustic wave device 1 including the first and second acoustic wave resonators.

Here, when the wavelength normalized film thickness of the LiTaO$_3$ film is equal to or smaller than about 350%, a Q value is able to be increased. In addition, as is apparent from FIG. 9, when the wavelength normalized film thickness of the LiaO$_3$ film is equal to or smaller than about 80%, the changes in TCFs between the first acoustic wave resonator and the second acoustic wave resonator are able to be canceled out even when the wavelength normalized film thickness of the silicon oxide film is any value equal to or smaller than about 10.0%. Therefore, it is possible to further effectively improve the frequency temperature characteristics.

Figure 10:
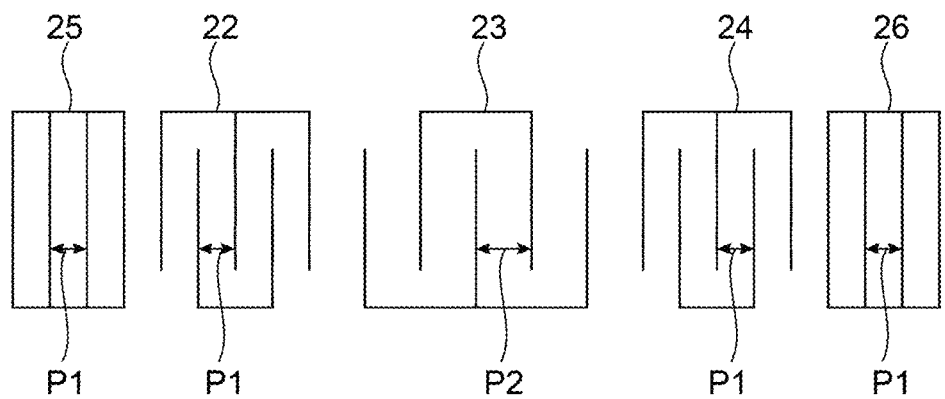
FIG. 10 is a schematic plan view illustrating a structure of electrodes included in an acoustic wave device according to a second preferred embodiment of the present invention.

FIG. 10 is a schematic plan view illustrating a structure of electrodes included in an acoustic wave device according to a second preferred embodiment of the present invention. The acoustic wave device of the second preferred embodiment is a longitudinally coupled resonator acoustic wave filter, which is preferably, for example, three-IDT longitudinally coupled resonator acoustic wave filter, including first to third IDT electrodes 22 to 24. Reflectors 25 and 26 are provided on both sides of a region where the first to third IDT electrodes 22 to 24 are provided, in an acoustic wave propagation direction.

In the acoustic wave device according to the second preferred embodiment, a laminated structure under the structure of the electrodes is preferably the same or substantially the same as that in the first preferred embodiment.

In the acoustic wave device according to the second preferred embodiment, the second electrode finger pitch P2 of the second IDT electrode 23 is larger than the first electrode finger pitch P1 of the first IDT electrode 22 and the third IDT electrode 24. The electrode finger pitch of the reflectors 25 and 26 is the same or substantially the same as P1.

Similarly to the first preferred embodiment, in the longitudinally coupled resonator acoustic wave filter including the first and third IDT electrodes 22 and 24 having the electrode finger pitch of P1 and the second IDT electrode 23 having the electrode finger pitch of P2, frequency temperature characteristics are able to be improved. That is, changes in TCF caused by changes in wavelength normalized film thicknesses of the LiTaO$_3$ film and the silicon oxide film at portions where the first and third IDT electrodes 22 and 24 are provided, and changes in TCF in the second IDT electrode 23 are able to be effectively canceled out. Therefore, it is possible to reduce the difference in temperature characteristics among at least the first IDT electrode 22 and third IDT electrode 24, and the second IDT electrode 23.

As is apparent from the acoustic wave device of the second preferred embodiment, in the present invention, a plurality of IDT electrodes having different electrode finger pitches may be provided in one acoustic wave element. In the first preferred embodiment, the first and second acoustic wave resonators are provided, but an acoustic wave filter may be configured instead of the acoustic wave resonator.

Figure 11:
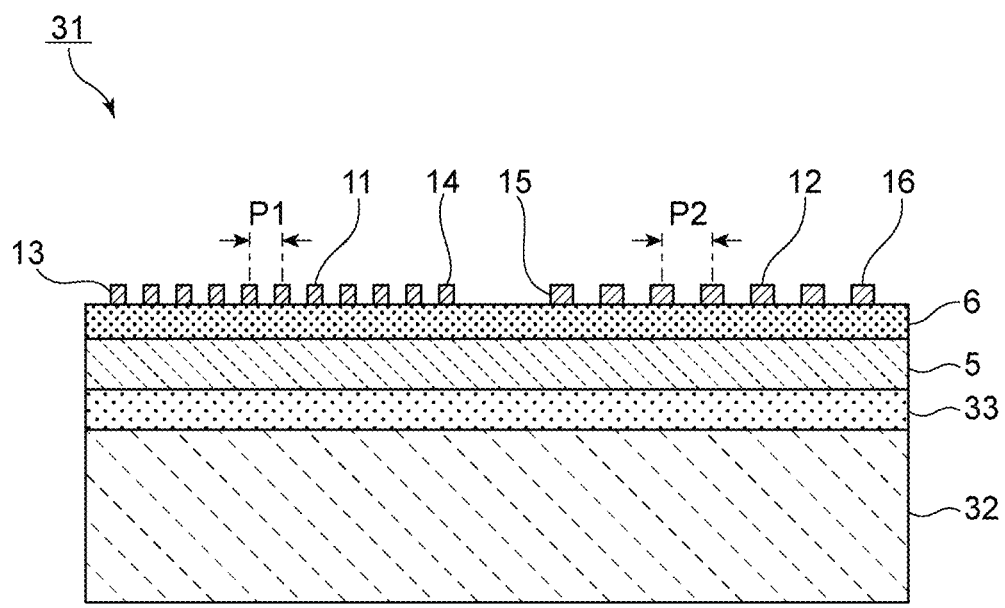
FIG. 11 is a front sectional view of an acoustic wave device according to a third preferred embodiment of the present invention.

FIG. 11 is a front sectional view of an acoustic wave device 31 according to a third preferred embodiment of the present invention. In the acoustic wave device 31 according to the third preferred embodiment, a low acoustic velocity film 33 is laminated on a supporting substrate 32. The supporting substrate 32 is made of a high acoustic velocity material in which an acoustic velocity of a bulk wave propagating through the high acoustic velocity material is higher than an acoustic velocity of an acoustic wave propagating through the piezoelectric thin film 5. In this manner, the high acoustic velocity film in the first preferred embodiment may be omitted by using the supporting substrate 32 made of the high acoustic velocity material.

Figure 12:
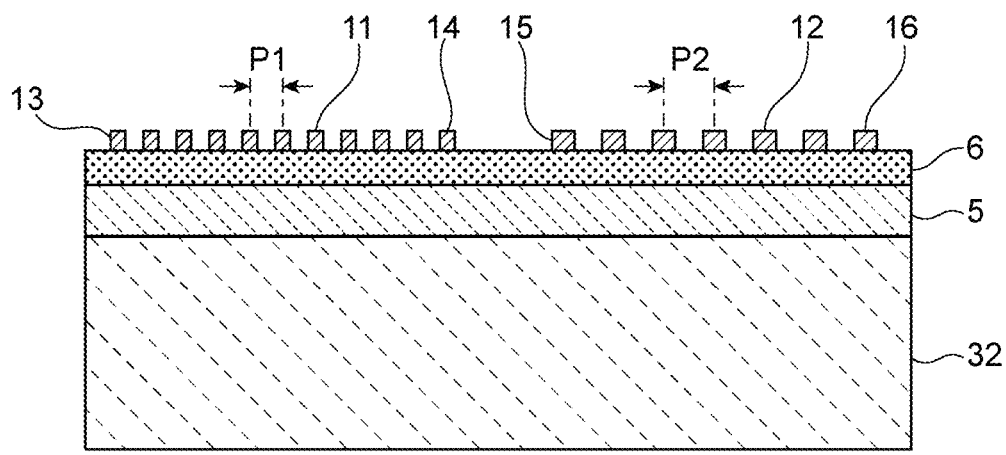
FIG. 12 is a front sectional view of an acoustic wave device according to a modification of the third preferred embodiment of the present invention.

Further, as in a modification illustrated in FIG. 12, the piezoelectric thin film 5 may be directly laminated on the supporting substrate 32 made of the high acoustic velocity material without providing the low acoustic velocity film 33.

The acoustic wave device of each of the above preferred embodiments can be used as a component such as a duplexer of a high-frequency front-end circuit. An example of such a high-frequency front-end circuit will be described below.

Figure 13:
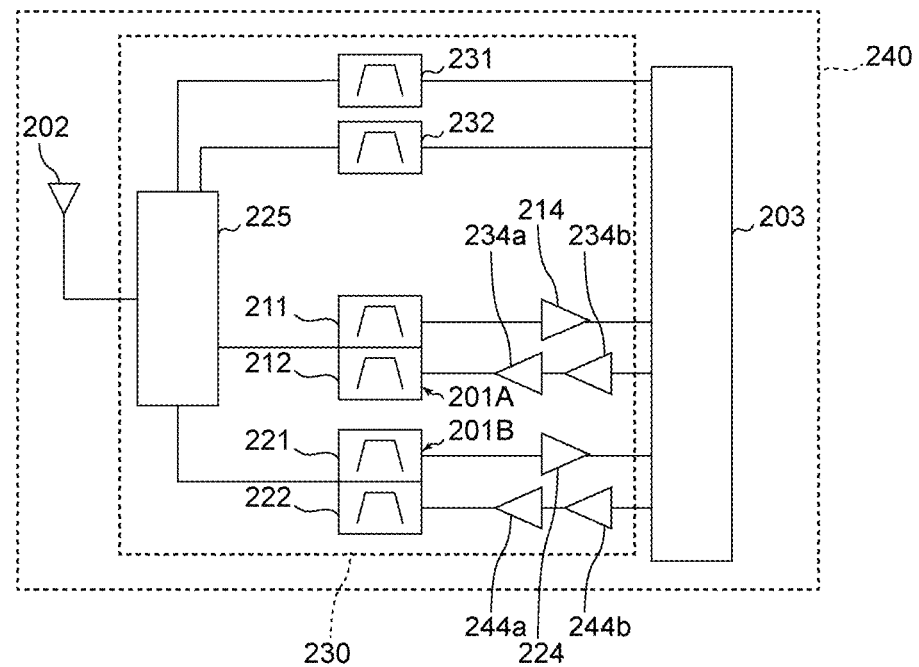
FIG. 13 is a block diagram of a communication device including a high-frequency front-end circuit according to a preferred embodiment of the present invention.

FIG. 13 is a block diagram of a communication device including a high-frequency front-end circuit according to a preferred embodiment of the present invention. In addition, in FIG. 13, respective components connected to a high-frequency front-end circuit 230, for example, an antenna element 202 and an RF signal processing circuit (RFIC) 203 are also illustrated. The high-frequency front-end circuit 230 and the RF signal processing circuit 203 define a communication device 240. Note that the communication device 240 may include a power supply, a CPU, and a display, for example.

The high-frequency front-end circuit 230 includes a switch 225, duplexers 201A and 201B, filters 231 and 232, low-noise amplifier circuits 214 and 224, and power amplifier circuits 234a, 234b, 244a, and 244b. Note that the high-frequency front-end circuit 230 and the communication device 240 illustrated in FIG. 13 are examples of a high-frequency front-end circuit and a communication device, and are not limited to this configuration.

The duplexer 201A includes filters 211 and 212. The duplexer 201B includes filters 221 and 222. The duplexers 201A and 201B are connected to an antenna element 202 via the switch 225. The acoustic wave devices according to preferred embodiments of the present invention may be the duplexers 201A and 201B, or may be filters 211, 212, 221, and 222. The acoustic wave devices according to preferred embodiments of the present invention may be an acoustic wave resonator defining the duplexers 201A and 201B or the filters 211, 212, 221, and 222.

Further, the acoustic wave devices according to preferred embodiments of the present invention may be applied to a multiplexer including three or more filters, for example, a triplexer including an antenna terminal shared by three filters and a hexaplexer including an antenna terminal shared by six filters, for example.

That is, the acoustic wave devices according to preferred embodiments of the present invention include an acoustic wave resonator, a filter, a duplexer, and a multiplexer including three or more filters. The multiplexer is not limited to a configuration including both a transmission filter and a reception filter, and may be configured to include either only a transmission filter or only a reception filter.

The switch 225 connects the antenna element 202 to a signal path corresponding to a predetermined band in accordance with a control signal from a control unit (not illustrated), and is preferably defined by, for example, a single pole double throw (SPDT) switch. Note that the signal path connected to the antenna element 202 is not limited to one, and two or more signal paths may be connected. That is, the high-frequency front-end circuit 230 may support carrier aggregation.

The low-noise amplifier circuit 214 is a reception amplifier circuit to amplify a high-frequency signal (here, a high-frequency reception signal) that has passed through the antenna element 202, the switch 225, and the duplexer 201A, and to output the amplified high-frequency signal to the RF signal processing circuit 203. The low-noise amplifier circuit 224 is a reception amplifier circuit to amplify a high-frequency signal (here, a high-frequency reception signal) that has passed through the antenna element 202, the switch 225, and the duplexer 201B, and to output the amplified high-frequency signal to the RF signal processing circuit 203.

The power amplifier circuits 234a and 234b are transmission amplifier circuits that amplify high-frequency signals (high-frequency transmission signals in this case) output from the RF signal processing circuit 203, and output the amplified high-frequency signals to the antenna element 202 via the duplexer 201A and the switch 225. The power amplifier circuits 244a and 244b are transmission amplifier circuits that amplify high-frequency signals (high-frequency transmission signals in this case) output from the RF signal processing circuit 203, and output the amplified high-frequency signals to the antenna element 202 via the duplexer 201B and the switch 225.

The RF signal processing circuit 203 performs signal-processing, such as down-conversion, for example, on a high-frequency reception signal input from the antenna element 202 via a reception signal path, and outputs a reception signal generated by performing the signal processing. The RF signal processing circuit 203 performs signal-processing, such as up-conversion, for example, on an input transmission signal, and outputs the high-frequency transmission signal generated by the signal processing to the power amplifier circuits 244a and 244b. The RF signal processing circuit 203 is preferably, for example, an RFIC. The communication device may include a baseband (BB) IC. In this case, the BBIC performs signal-processing on a reception signal processed by the RFIC. The BBIC performs signal-processing on a transmission signal and outputs the transmission signal to the RFIC. The reception signal processed by the BBIC, and the transmission signal before the signal processing by the BBIC are, for example, an image signal, a sound signal, and the like. Note that the high-frequency front-end circuit 230 may include other circuit elements between the components described above.

Note that the high-frequency front-end circuit 230 may include duplexers according to a modification of the duplexers 201A and 201B in place of the duplexers 201A and 201B.

On the other hand, the filters 231 and 232 in the communication device 240 are connected between the RF signal processing circuit 203 and the switch 225 without passing through the low-noise amplifier circuits 214 and 224 and the power amplifier circuits 234a, 234b, 244a, and 244b. The filters 231 and 232 are also connected to the antenna element 202 via the switch 225, similarly to the duplexers 201A and 201B.

According to the high-frequency front-end circuit 230 and the communication device 240 configured as described above, by including, as the acoustic wave devices according to preferred embodiments of the present invention, an acoustic wave resonator, a filter, a duplexer, a multiplexer including three or more filters, or the like, it is possible to reduce a difference in temperature characteristics between the portions where at least two IDT electrodes are provided.

Although the acoustic wave devices, the high-frequency front-end circuits, and the communication devices according to the preferred embodiments of the present invention have been described with reference to the preferred embodiments, other preferred embodiments that may be achieved by combining desired components in the above-described preferred embodiments, modifications achieved by making various modifications to the above-described preferred embodiments that may be conceived by a person skilled in the art without departing from the spirit and scope of the present invention, or various devices incorporating the high-frequency front-end circuits and the communication devices according to preferred embodiments of the present invention, are also included in the present invention.

Preferred embodiments of the present invention may be applied to a communication device, such as a cellular phone, for example, as an acoustic wave resonator, a filter, a duplexer, and a multiplexer applicable to a multi-band system, a front-end circuit, and a communication device.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a high acoustic velocity member;
a piezoelectric thin film laminated directly or indirectly on the high acoustic velocity member;
a silicon oxide film laminated on or above the piezoelectric thin film; and
a plurality of IDT electrodes laminated on or above the silicon oxide film; wherein
an acoustic velocity of a bulk wave propagating through the high acoustic velocity member is higher than an acoustic velocity of an acoustic wave propagating through the piezoelectric thin film;
the plurality of IDT electrodes include a plurality of IDT electrodes having different wavelengths determined by electrode finger pitches; and
when $\lambda$ represents a wavelength of an IDT electrode having a shortest wavelength among the plurality of IDT electrodes having different wavelengths, y represents a wavelength normalized film thickness that is a percentage of a film thickness of the piezoelectric thin film with respect to the wavelength $\lambda$, and x represents a wavelength normalized film thickness that is a percentage of a film thickness of the silicon oxide film with respect to the wavelength $\lambda$, y is equal to or smaller than about 350%, and $y<1.6x^{(-0.1)}+0.05x^{(-0.6)}-1$ is satisfied.

2. The acoustic wave device according to claim 1, wherein the wavelength normalized film thickness x of the silicon oxide film is 0<x<8(%).

3. The acoustic wave device according to claim 1, wherein the wavelength normalized film thickness y of the piezoelectric thin film is equal to or smaller than about 80%.

4. The acoustic wave device according to claim 1, further comprising:

a low acoustic velocity film laminated between the high acoustic velocity member and the piezoelectric thin film; wherein an acoustic velocity of a bulk wave propagating through the low acoustic velocity film is lower than an acoustic velocity of an acoustic wave propagating through the piezoelectric thin film.

5. The acoustic wave device according to claim 1, further comprising:

a supporting substrate; wherein the high acoustic velocity member is laminated on the supporting substrate.

6. The acoustic wave device according to claim 1, wherein the high acoustic velocity member defines and functions as a supporting substrate.

7. The acoustic wave device according to claim 1, wherein the high acoustic velocity member is made of at least one material selected from the group consisting of aluminum nitride, aluminum oxide, silicon carbide, silicon nitride, silicon, sapphire, lithium tantalate, lithium niobate, quartz crystal, alumina, zirconia, cordierite, mullite, steatite, forsterite, magnesia, silicon oxynitride, DLC, and diamond, or of a material containing the at least one material as a main component.

8. The acoustic wave device according to claim 4, wherein the low acoustic velocity film is made of at least one material selected from the group consisting of silicon oxide, glass, silicon oxynitride, tantalum oxide, and compounds obtained by adding fluorine, carbon, or boron to silicon oxide.

9. The acoustic wave device according to claim 5, wherein the supporting substrate is made of at least one material selected from the group consisting of a piezoelectric material such as silicon, aluminum nitride, aluminum oxide, silicon carbide, silicon nitride, silicon oxynitride, sapphire, lithium tantalate, lithium niobate, and quartz crystal, alumina, zirconia, cordierite, mullite, steatite, forsterite, diamond, and magnesia.

10. The acoustic wave device according to claim 1, wherein the plurality of IDT electrodes define a plurality of acoustic wave elements.

11. The acoustic wave device according to claim 10, wherein each of the plurality of acoustic wave elements is one of an acoustic wave resonator and an acoustic wave filter.

12. The acoustic wave device according to claim 1, wherein the plurality of IDT electrodes define a longitudinally coupled resonator acoustic wave filter.

13. The acoustic wave device according to claim 1, wherein the piezoelectric thin film is made of a $LiaO_3$ piezoelectric single crystal.

14. A high-frequency front-end circuit comprising:

the acoustic wave device according to claim 1; and a power amplifier.

15. The high-frequency front-end circuit according to claim 14, wherein the wavelength normalized film thickness x of the silicon oxide film is $0<x<8(\%)$.

16. The high-frequency front-end circuit according to claim 14, wherein the wavelength normalized film thickness y of the piezoelectric thin film is equal to or smaller than about 80%.

17. The high-frequency front-end circuit according to claim 14, further comprising:

a low acoustic velocity film laminated between the high acoustic velocity member and the piezoelectric thin film; wherein an acoustic velocity of a bulk wave propagating through the low acoustic velocity film is lower than an acoustic velocity of an acoustic wave propagating through the piezoelectric thin film.

18. The high-frequency front-end circuit according to claim 14, further comprising:

a supporting substrate; wherein the high acoustic velocity member is laminated on the supporting substrate.

19. The high-frequency front-end circuit according to claim 14, wherein the high acoustic velocity member defines and functions as a supporting substrate.

20. A communication device comprising:

the high-frequency front-end circuit according to claim 14; and an RF signal processing circuit.

* * * * *